(12) United States Patent
Hirler et al.

(10) Patent No.: US 9,954,056 B2
(45) Date of Patent: Apr. 24, 2018

(54) SEMICONDUCTOR DEVICE WITH SUPERJUNCTION STRUCTURE AND TRANSISTOR CELLS IN A TRANSITION REGION ALONG A TRANSISTOR CELL REGION

(71) Applicant: Infineon Technologies Austria AG, Villach (AT)

(72) Inventors: Franz Hirler, Isen (DE); Stefan Gamerith, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/418,300

(22) Filed: Jan. 27, 2017

(65) Prior Publication Data

US 2017/0221989 A1  Aug. 3, 2017

(30) Foreign Application Priority Data

Jan. 29, 2016 (DE) .................... 10 2016 101 647

(51) Int. Cl.
| | |
|---|---|
| H01L 29/06 | (2006.01) |
| H01L 29/10 | (2006.01) |
| H01L 27/082 | (2006.01) |
| H01L 27/088 | (2006.01) |
| H01L 29/739 | (2006.01) |
| H01L 29/78 | (2006.01) |

(52) U.S. Cl.
CPC ........ H01L 29/0634 (2013.01); H01L 27/088 (2013.01); H01L 27/0823 (2013.01); H01L 29/0696 (2013.01); H01L 29/1095 (2013.01); H01L 29/7395 (2013.01); H01L 29/7827 (2013.01)

(58) Field of Classification Search
CPC ........ H01L 29/10; H01L 29/06; H01L 29/78; H01L 27/088; H01L 27/0823; H01L 29/02; H01L 29/08; H01L 29/40; H01L 29/739; H01L 29/82; H01L 29/8249; H01L 29/0634; H01L 29/0696; H01L 29/7827
USPC ........................................... 257/192
See application file for complete search history.

(56) References Cited

U.S. PATENT DOCUMENTS

| | | |
|---|---|---|
| 8,866,221 B2 | 10/2014 | Hirler et al. |
| 2013/0299896 A1 | 11/2013 | Yao et al. |
| 2015/0115355 A1 | 4/2015 | Hirler et al. |

FOREIGN PATENT DOCUMENTS

DE 102013106902 A1 1/2014

*Primary Examiner* — Chuong A Luu
(74) *Attorney, Agent, or Firm* — Murphy, Bilak & Homiller, PLLC

(57) ABSTRACT

A semiconductor device includes a transistor cell region and a transition region. The transistor cell region includes a first portion of a super junction structure and a first contact structure electrically connecting a first load electrode with first source zones of transistor cells. The first source zones are formed on opposite sides of the first contact structure. The transition region directly adjoins to the transistor cell region and includes a second portion of the super junction structure and a second contact structure electrically connecting the first load electrode with a second source zone. The second source zone is formed only at a side of the second contact structure oriented to the transistor cell region.

18 Claims, 17 Drawing Sheets

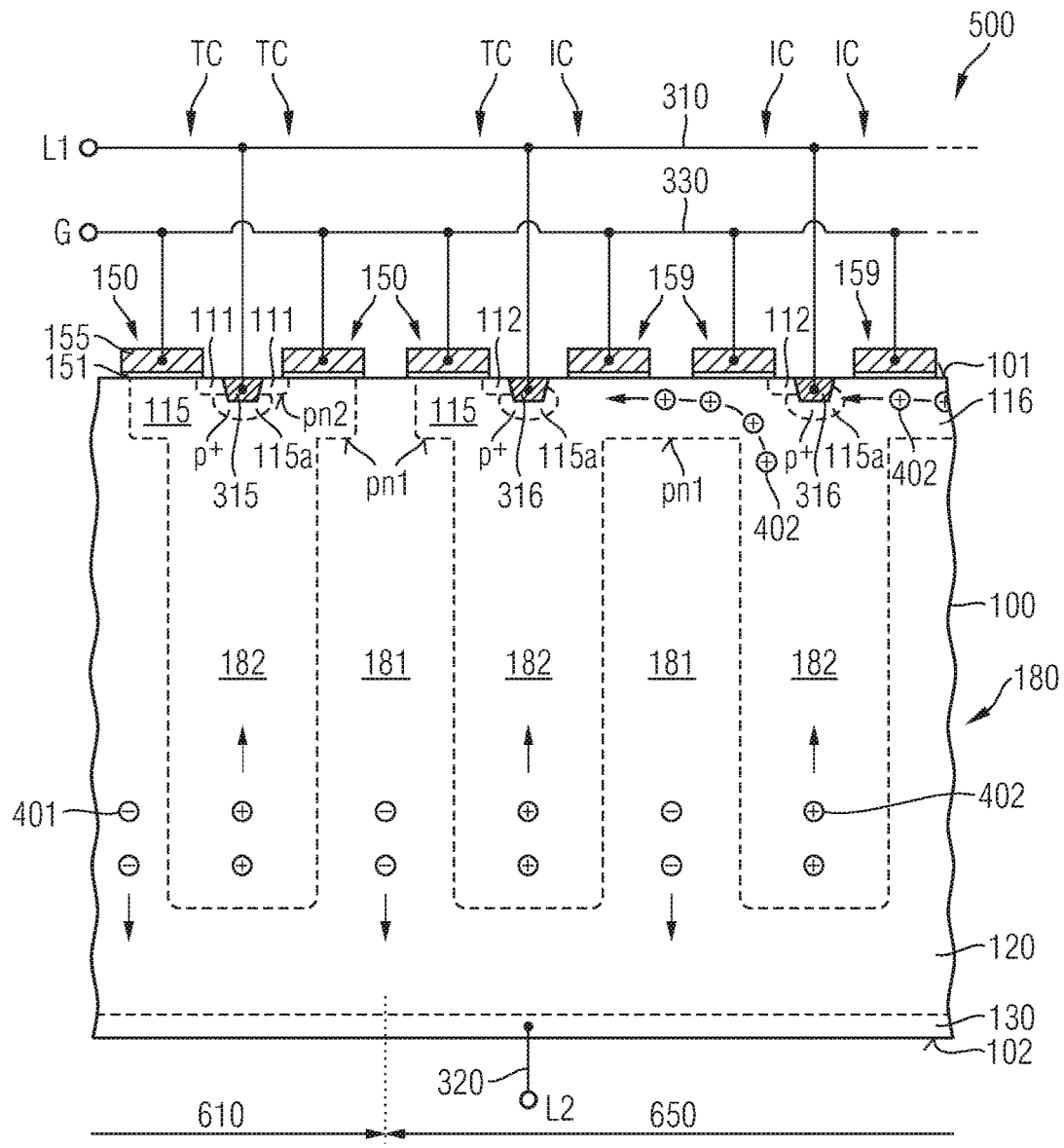

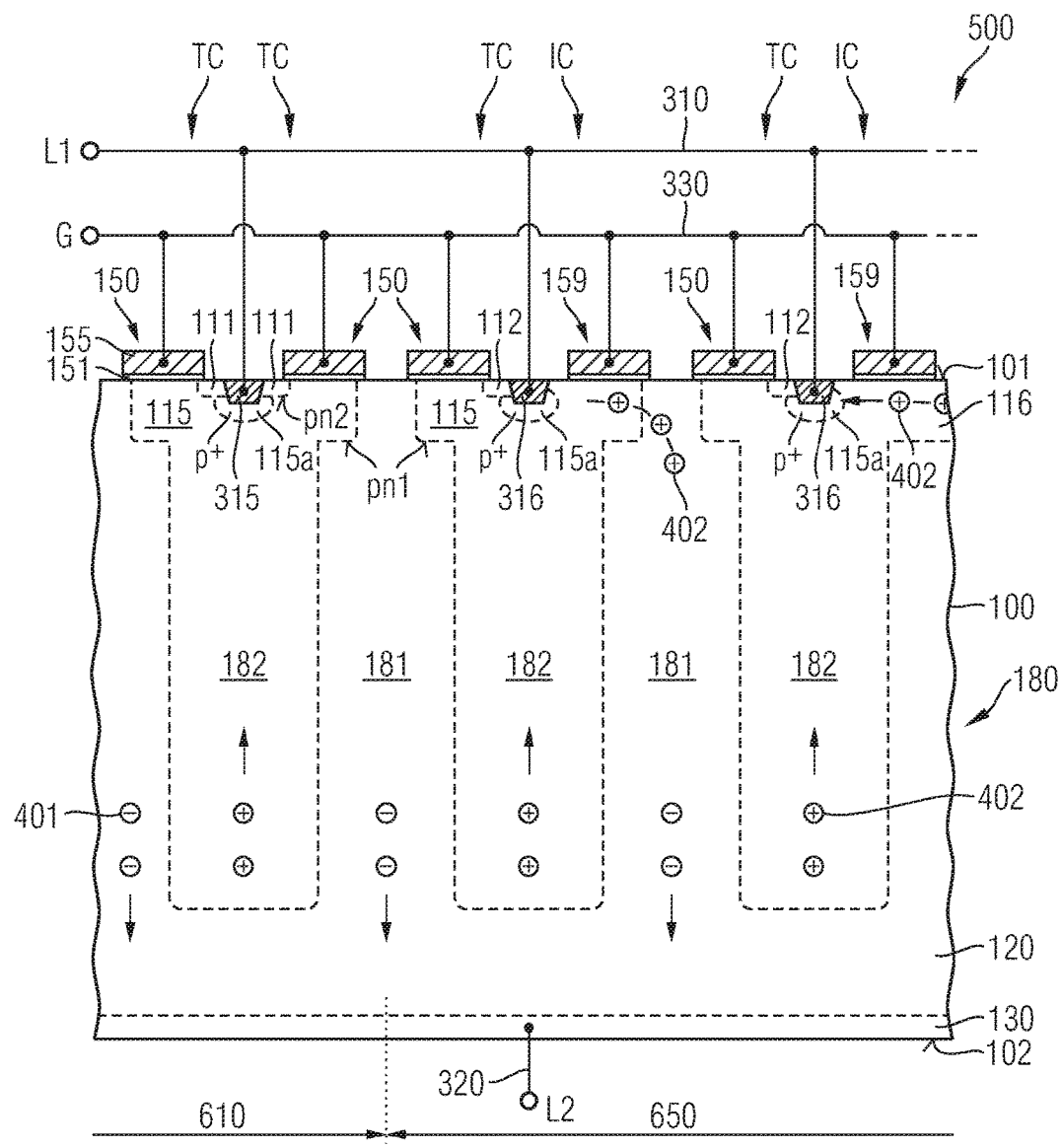

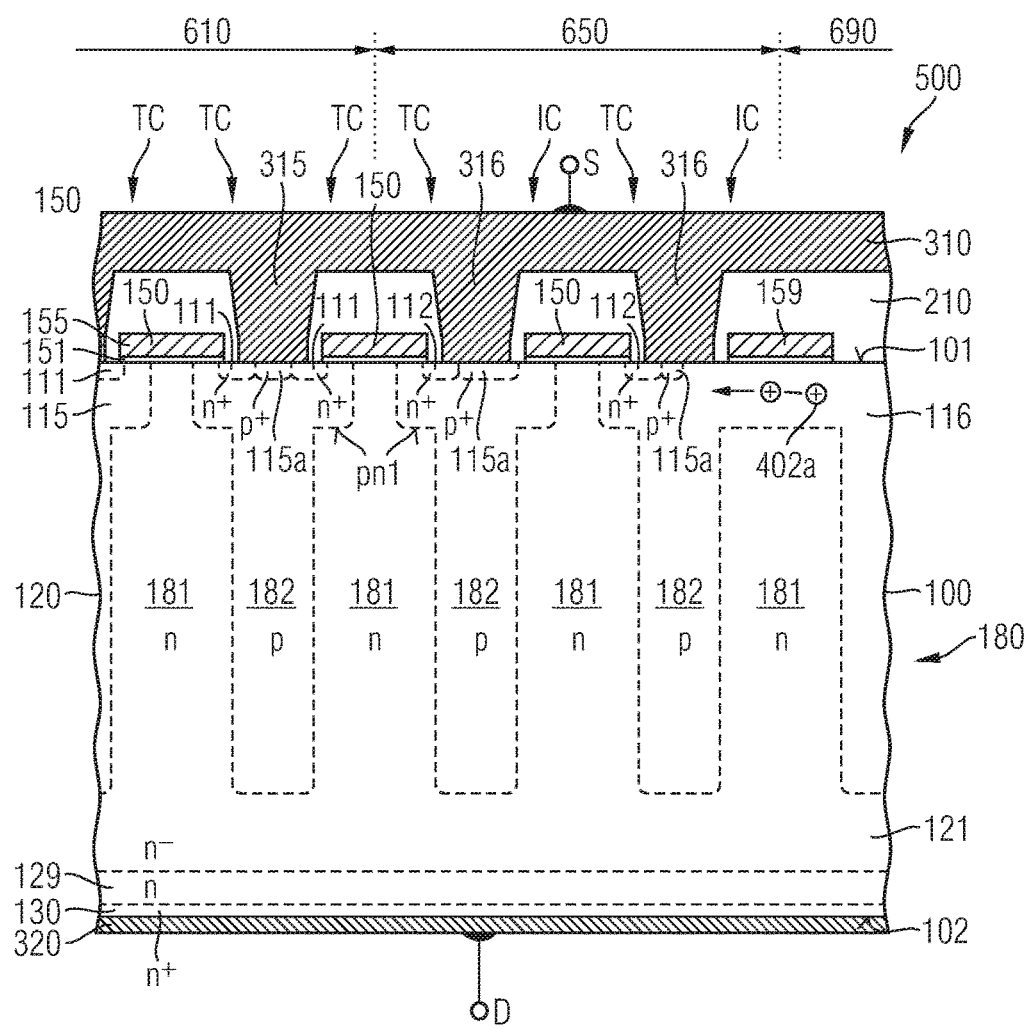

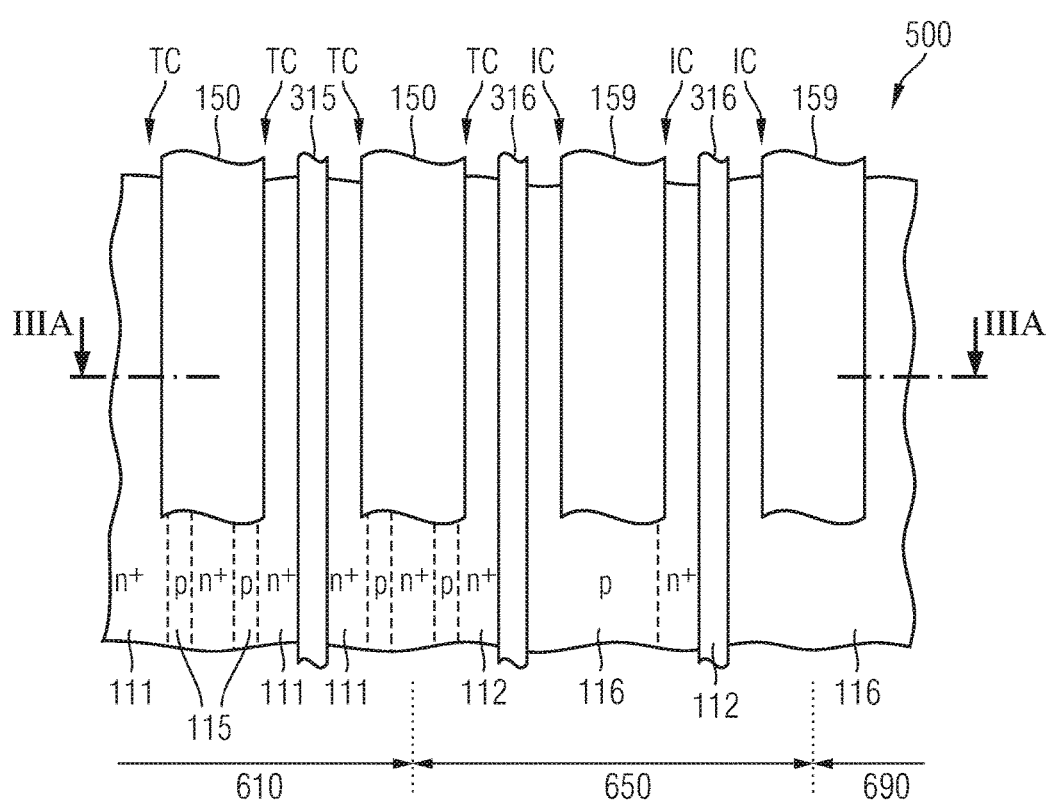

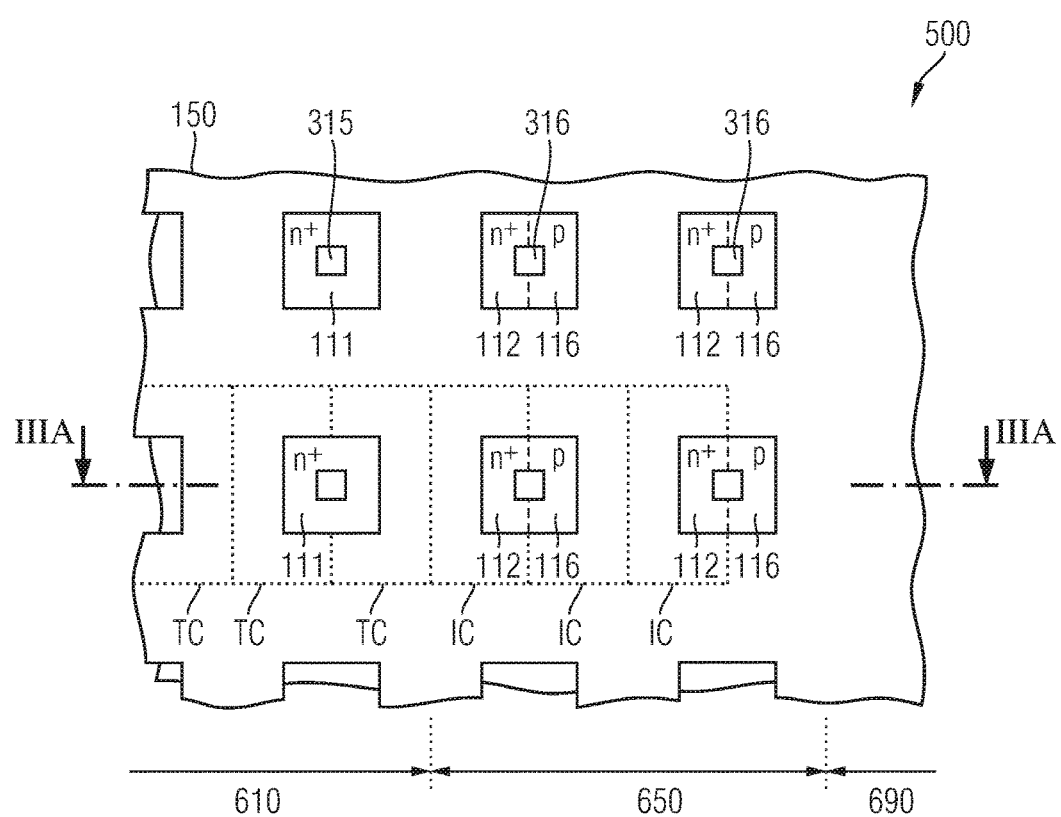

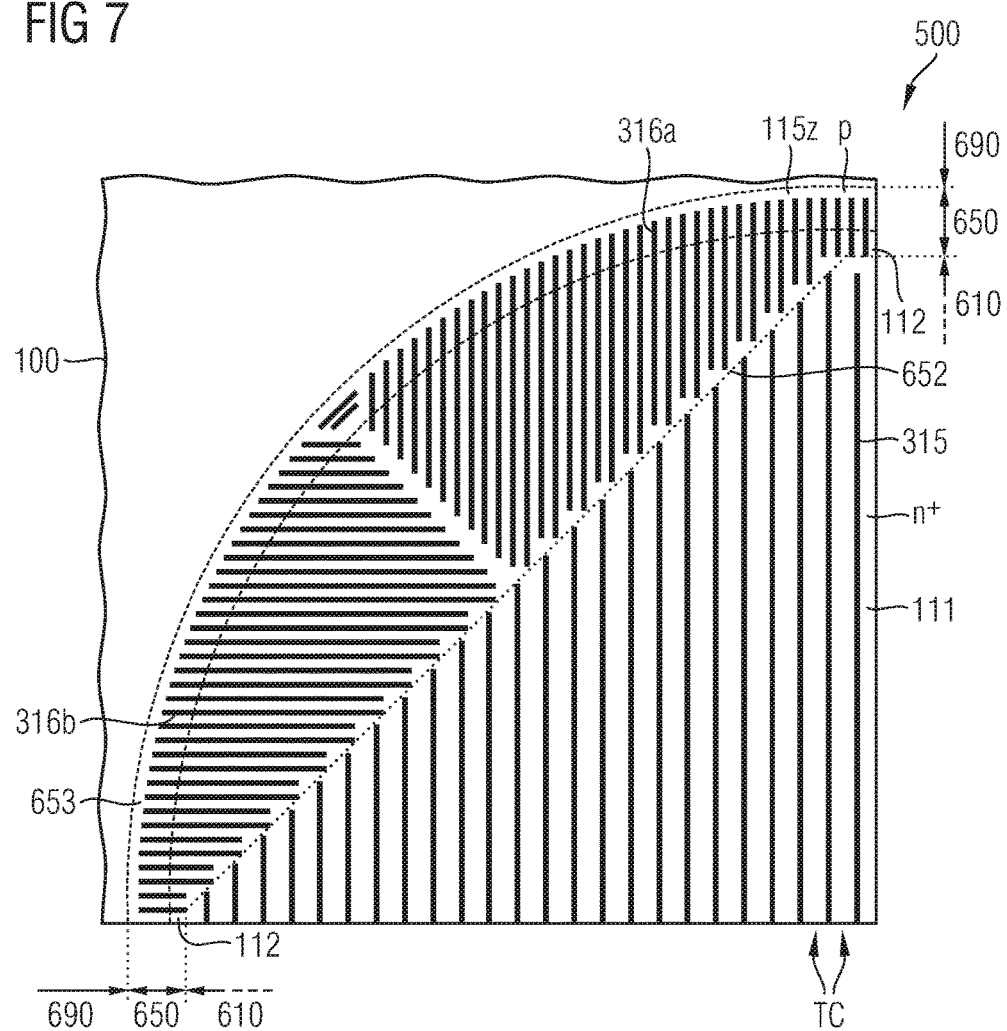

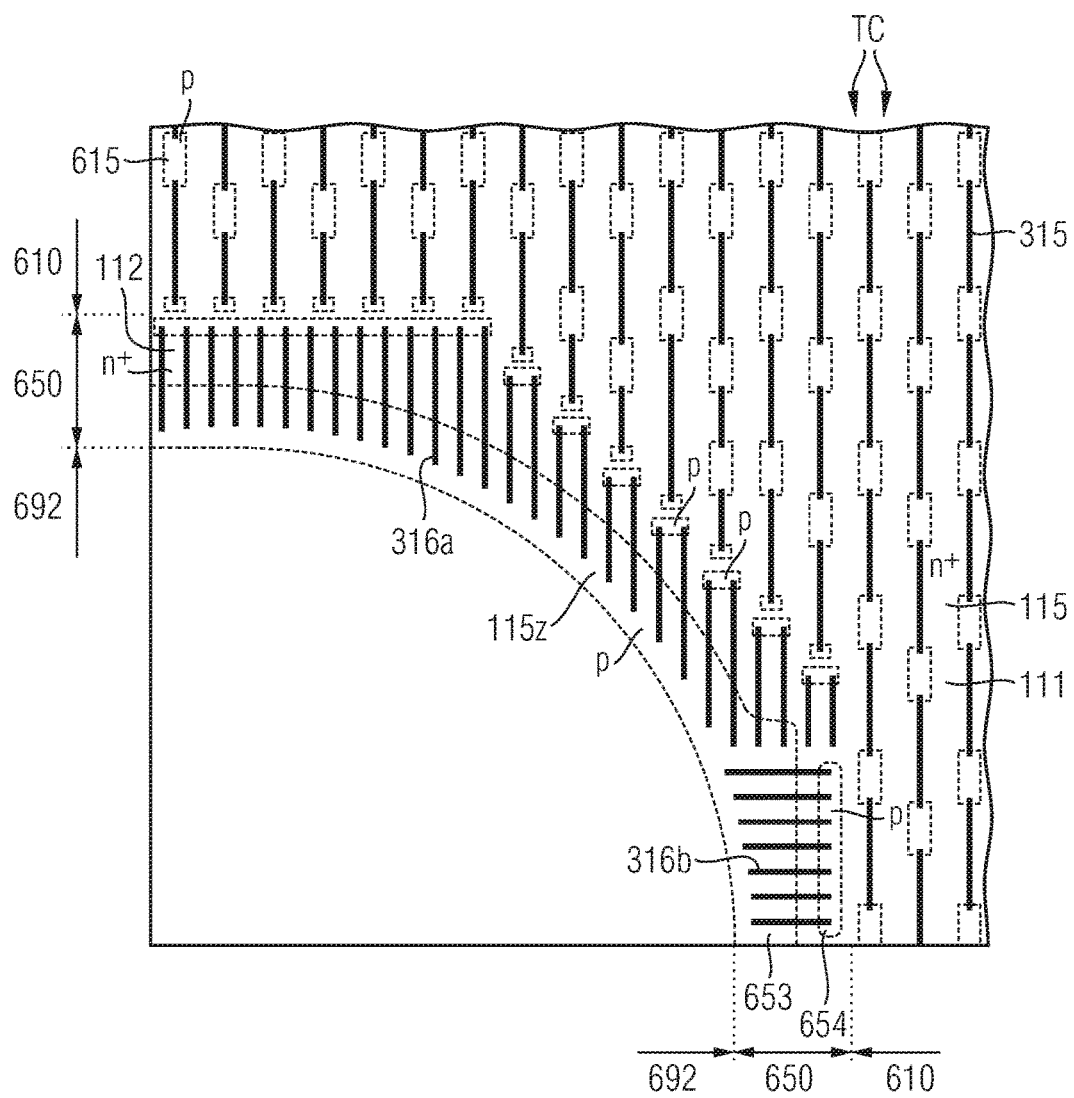

SEMICONDUCTOR DEVICE WITH SUPERJUNCTION STRUCTURE AND TRANSISTOR CELLS IN A TRANSITION REGION ALONG A TRANSISTOR CELL REGION

BACKGROUND

Power semiconductor devices conduct a load current at low on-state resistance Rdson and withstand a high blocking voltage a forward-biased state. In superjunction semiconductor devices charge carriers in oppositely doped first and second regions of a superjunction structure cancel out each other such that a high blocking capability can be achieved even at high dopant concentrations in the first and second regions of the superjunction structure. In a reverse-biased state charge-carriers injected into the semiconductor die diffuse into a termination region of the semiconductor die. The injected charge carriers are drained off from the semiconductor die when the voltage applied across the semiconductor die changes from reverse-biased to forward-biased.

It is desirable to improve the switching characteristics of superjunction semiconductor devices.

SUMMARY

According to an embodiment a semiconductor device includes a transistor cell region with a first portion of a superjunction structure. A first contact structure electrically connects a first load electrode with first source zones of transistor cells, wherein the first source zones are formed on opposite sides of the first contact structure. A transition region directly adjoins to the transistor cell region and includes a second portion of the superjunction structure. A second contact structure electrically connects the first load electrode with a second source zone. The second source zone is formed only at a side of the second contact structure that is oriented to the transistor cell region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings are not necessarily to scale, illustrate the embodiments of the present invention, and together with the description serve to explain principles of the invention. Other embodiments of the invention and intended advantages will be readily appreciated as they become better understood by reference to the following detailed description.

FIG. 1A is a schematic vertical cross-sectional view of a portion of semiconductor device including a transition region with transistor cells with an asymmetric source zone only formed at a side of a contact structure that is oriented to a transistor cell region according to an embodiment.

FIG. 1B is a schematic vertical cross-sectional view of a portion of semiconductor device including a transition region with transistor cells with two, asymmetric source zones according to another embodiment.

FIG. 3C is a schematic vertical cross-sectional view of a portion of semiconductor device according to an embodiment with contact structures ending on the substrate surface.

FIG. 4A is a schematic plan view of a semiconductor device with the vertical cross-section as illustrated in FIG. 3A according to an embodiment related to stripe-shaped transistor cells.

FIG. 4B is a schematic plan view of a semiconductor device with the vertical cross-section as illustrated in FIG. 3A according to an embodiment related to approximately square-shaped transistor cells.

FIG. 7 is a schematic plan view of a corner portion of a semiconductor device according to an embodiment concerning a transition region between a transistor cell region and a termination region.

FIG. 8B is a schematic plan view of a portion of a semiconductor device close to a gate pad according to another embodiment with discontinuous transistor cells.

DETAILED DESCRIPTION

Figure 2:
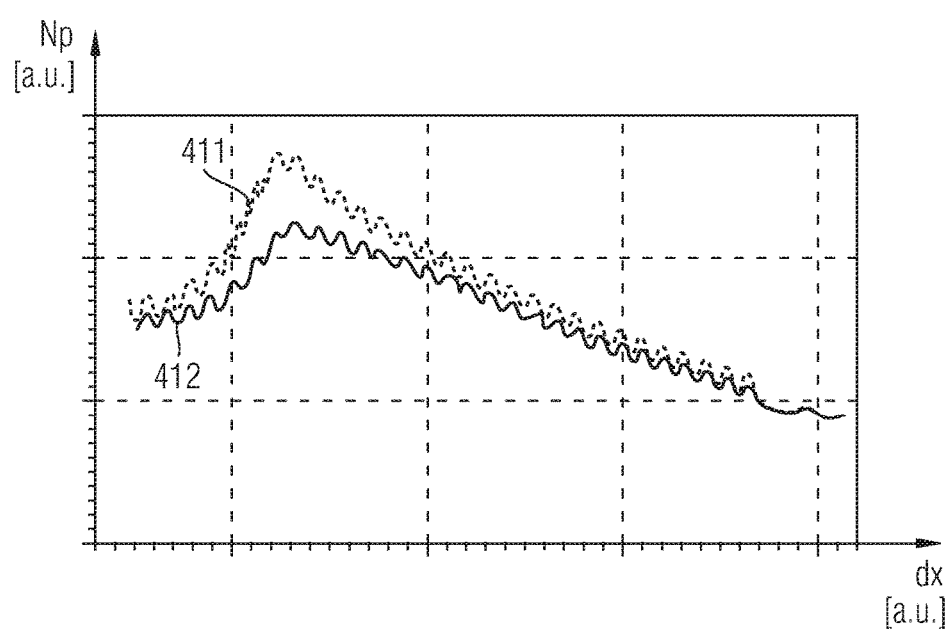
FIG. 2 is a schematic diagram illustrating minority charge carrier densities in a drift zone for illustrating effects of the embodiments.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohm is electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A and 1B show a superjunction semiconductor device 500 including a plurality of identical FET (field effect transistor) cells TC. The semiconductor device 500 may be or may include an IGFET, for example an MOSFET (metal oxide semiconductor FET) in the usual meaning including FETs with metal gates as well as FETs with semiconductor gates or an RC-IGBT (reverse-conducting insulated gate bipolar transistor), by way of example. The semiconductor device 500 is based on a semiconductor body 100 from a single-crystalline semiconductor material such as silicon (Si), germanium (Ge), a silicon germanium crystal (SiGe), silicon carbide (SiC), gallium nitride (GaN), gallium arsenide (GaAs) or any other $A_{III}B_V$ semiconductor.

At a front side, the semiconductor body 100 has a first surface 101 which may be approximately planar or which may be given by a plane spanned by coplanar surface sections. A planar second surface 102 on the back of the semiconductor body 100 is parallel to the first surface 101. A minimum distance between the first and second surfaces 101, 102 is selected to achieve a specified voltage blocking capability of the semiconductor device 500. An outer lateral surface connects the first and second surfaces 101, 102.

In a plane perpendicular to the cross-sectional plane the semiconductor body 100 may have a rectangular shape with an edge length in the range of several millimeters or centimeters. A normal to the first surface 101 defines a vertical direction and directions orthogonal to the vertical direction are horizontal directions.

The semiconductor body 100 includes a drift structure 120 as well as a contact layer 130 between the drift structure 120 and the second surface 102.

A dopant concentration in the contact layer 130 along the second surface 102 is sufficiently high to form an ohmic contact with a metal directly adjoining to the second surface 102. In case the semiconductor body 100 is based on silicon Si, along the second surface 102 a dopant concentration in an n-type contact layer 130 may be at least $1E18$ cm$^{-3}$, for example at least $5E19$ cm$^{-3}$. A dopant concentration in a p-type contact layer 130 is at least $1E16$ cm$^{-3}$, for example at least $5E17$ cm$^{-3}$.

The contact layer 130 and the drift structure 120 may form a unipolar homojunction in case the semiconductor device 500 is an IGFET. In case the semiconductor device 500 is an RC-IGBT the contact layer 130 includes both p-type zones and n-type zones and alternatingly form unipolar homojunctions and pn junctions.

The drift structure 120 includes a superjunction structure 180 effective as compensation structure and including first regions 181 of a first conductivity type and second regions 182 of a complementary second conductivity type. The first and second regions 181, 182 alternate along one horizontal direction or along two orthogonal horizontal directions.

The first and second regions 181, 182 may be formed by depositing material containing dopants into trenches, which are temporarily formed in the drift structure 120, and partially outdiffusing the dopants into remnant portions of the original drift structure 120, wherein surfaces that connect points of equal dopant concentration in the first and second regions 181, 182 may be without undulation and may run approximately parallel to the contour of the original trenches such that surfaces that connect points of equal dopant concentration do not show concave and convex portions. According to other embodiments, the first and second regions 181, 182 may result from a multi-epitaxial/multi-implant process, wherein surfaces that connect points of equal dopant concentration in the first and second regions 181, 182 may be undulated and may show a plurality of concave and convex portions.

The dopant concentrations in the first and second regions 181, 182 may be adjusted to each other, e.g., the dopant concentrations may be approximately equal such that a portion of the drift structure 120 including the superjunction structure 180 gets homogeneously depleted in a blocking state of the semiconductor device 500.

In a transistor cell region 610, which includes a first portion of the superjunction structure 180, transistor cells TC are formed at the front side of the semiconductor body 100 along the first surface 101. The transistor cells TC in the transistor cell region 610 include body zones 115 of the second conductivity type forming first pn junctions pn1 with the first regions 181. First source zones 111 assigned to the transistor cells TC in the transistor cell region 610 form second pn junctions pn2 with the body zones 115. The body zones 115 may be wells extending from the first surface 101 into the semiconductor body 100 and separate the first source zones 111 from the first regions 181. The first source zones 111 may be wells extending from the first surface 101 into the body zones 115.

Gate structures 150 of the transistor cells TC include a conductive gate electrode 155, which may include or consist of a heavily doped polycrystalline silicon layer or a metal-containing layer. A gate dielectric 151 separates the gate electrode 155 from the semiconductor body 100 and capacitively couples the gate electrode 155 to channel portions of the body zones 115. The gate dielectric 151 may include or consist of a semiconductor oxide, for example thermally grown or deposited silicon oxide, semiconductor nitride, for example deposited silicon nitride, a semiconductor oxynitride, for example silicon oxynitride, or a combination thereof. According to the illustrated embodiment the gate structures 150 are planar gates formed outside of the semiconductor body 100 along the first surface 101. According to another embodiment the gate structures 150 are trench gates extending from the first surface 101 into the semiconductor body 100.

At the front side first contact structures 315 electrically connect a first load electrode 310 to the first source zones 111 and to the body zones 115 of the transistor cells TC, wherein the first contact structures 315 directly adjoin to heavily doped body contact regions 115a of the body zones 115. The first load electrode 310 forms or may be electrically connected or coupled to a first load terminal L1, which may be a source terminal of an IGFET or an emitter terminal of an RC-IGBT. The gate electrodes 155 are electrically connected to a control electrode 330, which may form or which may be electrically connected or coupled to a gate terminal G.

The contact layer 130 forms an ohmic contact with a second load electrode 320 that may form or which may be electrically connected or coupled to a second load terminal L2, which may be a drain terminal of an IGFET or a collector terminal of an RC-IGBT.

In a forward biased state, the transistor cells TC are controllable to let a portion of a load current pass between the first source zones 111 and the first regions 181 through the body zones 115 in an on-state and to block a load current through the body zones 115 in an off-state. In a reverse-biased state, the body zones 115 inject holes and the contact layer 130 injects electrons into the drift structure 120.

A transition region 650 that directly adjoins to the transistor cell region 610 includes a second portion of the superjunction structure 180. The transition region 650 may separate the transistor cell region 610 from idle device regions without direct connection to the first load electrode 310, e.g., a termination region, a gate region or embedded sense regions.

The transition region 650 may include idle cells IC, transistor cells TC, or both. The idle cells IC include some or all of the structural features of the transistor cells TC. Other than the transistor cells TC, the idle cells IC are not controllable in a way that a current through the idle cells can be turned on and off.

FIG. 1A shows a transition region 650 that includes a transistor cell TC next to the transistor cell region 610 as well as idle dells IC with no drain-side connection to the first regions 181 in the rest of the illustrated section of the transition region 650.

FIG. 1B shows a transition region 650 with two transistor cells TC separated by an idle cell IC.

The idle cells IC may include idle gates 159 with the same structural configuration as the gate structures 150 in the transistor cell region 610. Gate electrodes 155 of the idle gates 159 may be or may not be electrically connected to the control electrode 330.

A body extension zone 116 may directly adjoin to the first surface 101 and may separate the first regions 181 of the second portion of the superjunction structure 180 from the first surface 101 and may connect neighboring ones of the second regions 182 of the second portion of the superjunction structure 180. The body extension zone 116 and the body zones 115 may result from the same implant process such that the body extension zone 116 and the body zones 115 are different portions of the same body implant region.

In the transistor cell region 610 the first contact structures 315 directly adjoin to and form ohmic contacts with the first source zones 111 and the body zones 115 of neighboring transistor cells TC. The first source zones 111 are symmetric with respect to a center axis of the intermediate first contact structure 315, wherein the center axis runs parallel to an interface between the transistor cell region 610 and the transition region 650. In the illustrated embodiments, two first source zones 111 are formed at opposite sides of the first contact structure 315 in the transistor cell region 610.

In the transition region 650 a second contact structure 316 directly adjoins to an asymmetric second source zone 112, wherein the second contact structure 316 electrically connects the second source zone 112 with the first load electrode 310. The second source zone 112 is exclusively formed at the side oriented to the transistor cell region 610. The second source zone 112 is asymmetric with respect to a center axis of the second contact structure 316, wherein the center axis runs parallel to an interface between the transistor cell region 610 and the transition region 650. No portion of a source zone is formed at the opposite side of the second contact structure 316 averted from the transistor cell region 610.

According to an embodiment the side opposite to the first source zone 111 may be completely from a conductivity type opposite to that of the source zones 111, 112. According to another embodiment, a doped region formed at a side of the second contact structure 316 opposite to the second source zone 112 may have the same conductivity type as the source zone 112 but a mean net dopant dose is at most a third, e.g. at most a tenth of that of the second source zone 112.

In the illustrated embodiments and for the following description, the first conductivity type is n-type and the second conductivity type is p-type. Similar considerations as outlined below apply to embodiments with the first conductivity type being p-type and the second conductivity type being n-type.

When in a forward biased state, i.e., with a positive voltage drop between the second load terminal L2 and the first load terminal L1 a voltage applied to the gate terminal G exceeds a preset threshold voltage, electrons accumulate in channel portions of the body zones 115 directly adjoining to the gate dielectric 151 and form inversion channels making the first and second pn junctions pn1 and pn2 transparent for electrons such that an electron current flows from the first load electrode 310 to the second load electrode through the semiconductor device 500.

In a reverse-biased state with a positive voltage drop between the first load terminal L1 and the second load terminal L2, the first pn junctions pn1 are forward biased. Holes are injected into the drift structure 120 through the first and second contact structures 315, 316. Electrons are injected into the drift structure 120 through the contact layer 130. The resulting high charge carrier density results in low forward resistance of the body diode of the semiconductor device 500.

When the voltage applied across the semiconductor device 500 changes polarity from reverse-biased back to forward biased or in case of an avalanche breakdown, electrons 401 are drained off to the second load electrode 320 through the contact layer 130. Holes 402 are drained off from the drift structure 120 through the body extension zone 116 and the body zones 115 to the first and second contact structures 315, 316 electrically connecting the body extension zone 116 and the body zones 115 with the first load electrode 310. Charge carriers are also drained off from the transition region 650 and idle regions in which no contact structures to the first load electrode 310 are formed. As a result, a portion of the holes 402 flows through the body extension zone 116 or through the first zones 181 and the forward-biased first pn junctions p1 of FIG. 1A, or, in case of FIG. 1B, parallel to the first surface 101 in direction of more inwardly arranged second contact structures 316. The flow of holes 402 along n-doped regions connected to the first load electrode 310 may result in a positive voltage drop in the body zones 115 along the interface to the n-doped region such that a parasitic npn BJT (bipolar junction transistor) turns on that is formed from the n-doped region, the body zones 115 or body extension zone 116 and the n-type first regions 181 of the superjunction structure 180. Once turned on, the BJT may locally generate a high collector current. Due to the negative temperature coefficient in the semiconductor body 100, current density may locally increase and irreversibly damage the crystal lattice of the semiconductor body 100.

For this reason, typically no source zones at all are formed in the transition region 650. But in the reverse-biased mode, omitting the source zones increases the injection of holes into the semiconductor body 100 in the transition region 650 and also increases diffusion of holes into the termination region 690.

By forming, in the transition region 650, second source zones 112 only at the side of a contact structure oriented to the transistor cell region 610, the charge carrier plasma density outside of the transistor cell region 610 can be decreased without the risk that in case of commutation or avalanche breakdown the flow of holes 402 along source zones turns on a parasitic BJT. A voltage drop along the second pn junctions pn2 along the asymmetric second source zones 112 is negative with respect to the potential at the second contact structure 316 and does not turn on the parasitic BJT.

Other than in semiconductor devices without superjunction structure, in case of commutation, the p-doped regions of the superjunction structure 180 drain off holes uniformly across nearly the complete vertical extension of the drift structure 120. As a consequence the portion of the commutation current originating from the transistor cell region 610 drops abruptly and the voltage across the semiconductor body 100 rises while holes are still present in the termination region 690. Therefore, in superjunction devices, draining off holes from the termination region 690 takes place at higher voltages and is more critical. Avalanche breakdown is stronger and can locally induce a critical amount of thermal energy.

In FIG. 2 the dotted line 411 schematically shows, in arbitrary units, the hole density Np as a function of a distance dx to the second contact structure 316 on a side averted from the transistor cell region 610 for a reference device without second source zones. The continuous line 412 shows the hole density Np in the semiconductor body 100 as a function of the distance to the second contact structure 316 with an asymmetric second source zone at the side oriented to the transistor cell region 610. The presence of the asymmetric second source zones 112 decreases the maximum hole density by more than 10%.

Typically, the first source zones 111 are defined by a photolithographic mask that covers idle regions, e.g., a termination region and that exposes the transistor cell region 610. By slight and uncritical modifications of the mask, one-sided asymmetric second source zones 112 may be defined in the transition region 650 without additional effort and without loss of device reliability.

Figure 3A:
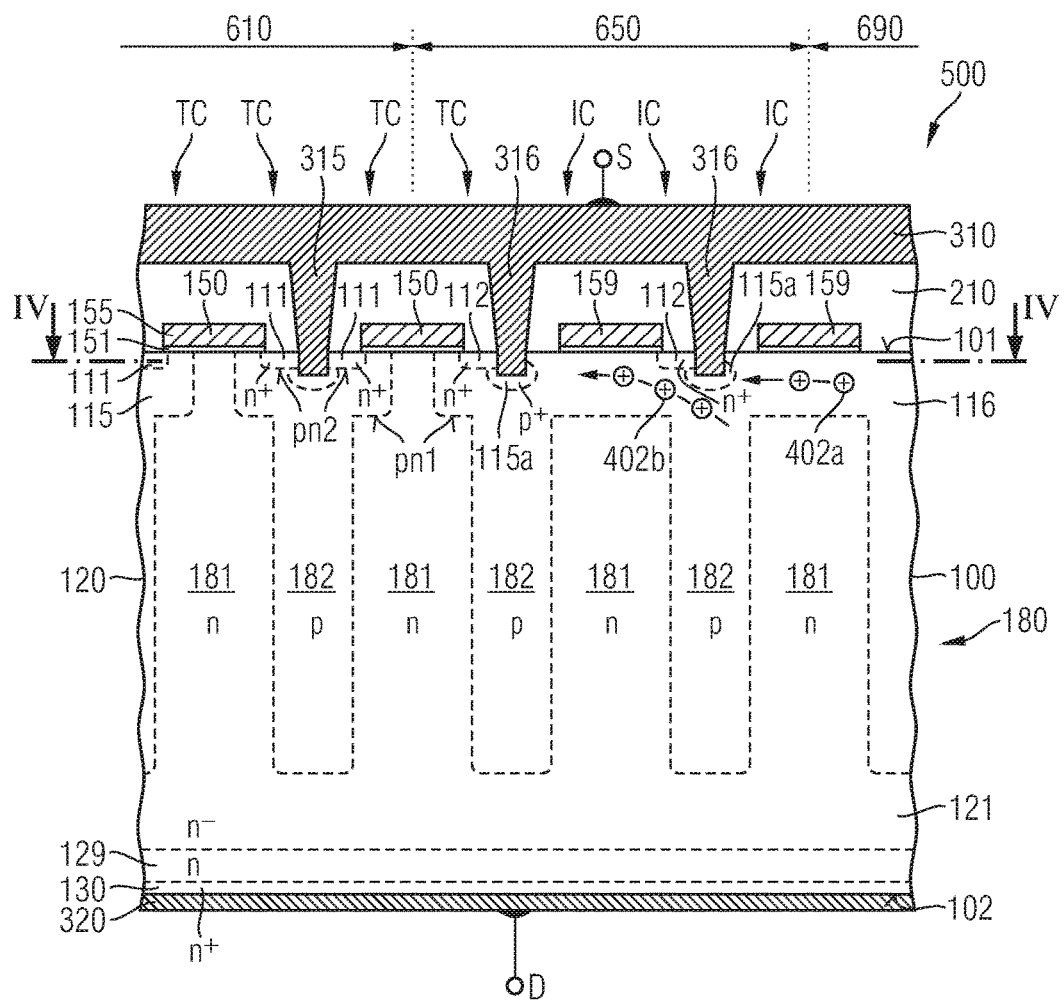
FIG. 3A is a schematic vertical cross-sectional view of a portion of semiconductor device according to an embodiment with a transition region formed between a transistor cell region and a termination region without contact structures to a first load electrode.

In FIG. 3A, the semiconductor device 500 is an n-FET with $n^+$ doped first and second source zones 111, 112, an $n^+$ doped contact layer 130, p doped body zones 115 and a p doped body extension zone 116. The drift structure 120 may include a drift zone 121 between the superjunction structure 180 and the second surface 102. According to an embodiment, the dopant concentration in the drift zone 121 may be approximately uniform in a range from $5E12$ $cm^{-3}$ to $1E16$ $cm^{-3}$, for example in a range from $5E13$ $cm^{-3}$ to $5514$ $cm^{-3}$.

A field stop layer 129 forming a unipolar homojunction with the drift zone 121 may separate the drift zone 121 from the contact layer 130. A mean dopant concentration in the field stop layer 129 may be at least 20% of a mean dopant concentration in the first regions 181 and at most one-fifth of a maximum dopant concentration in the contact layer 130.

An interlayer dielectric 210 may insulate the gate electrodes 155 from the first load electrode 310. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first and second contact structures 315, 316 extend through openings in the interlayer dielectric 210 and electrically connect the first load electrode 310 through heavily doped contact regions with the body zones 115, with the body extension zone 116, and with the first and second source zones 111, 112. The first load electrode 310 may form or may be electrically connected to the source terminal S of the n-FET. The second load electrode 320, which directly adjoins to a second surface 102 and the contact layer 130 may form or may be electrically connected to the drain terminal D.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent (s), nickel (Ni), titanium (Ti), tungsten (W), tantalum (Ta), vanadium (VD), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, N, and pd as main constituent(s), e.g., a suicide, a nitride and/or an alloy.

The semiconductor device 500 includes a transistor cell region 610 with transistor cells TC and the first contact structures 315 as well as a transition region 650 with transistor cells TC, idle cells IC and second contact structures 316 as described in detail with reference to FIG. 1.

In addition, the semiconductor device 500 includes a termination region 690 directly adjoining to the transition region 650 such that the transition region 650 is sandwiched between the transistor cell region 610 and the termination region 690. The termination region 690 is completely free from transistor cells TC and idle cells IC as well as contact structures between the first load electrode 310 and the semiconductor body 100.

The termination region 690 may or may not include a further portion of the superjunction structure 180. When the semiconductor device 500 changes from reverse-biased to forward-biased and holes are drained off through the first and second contact structures 315, 316 to the first load electrode 310, first holes 402a flowing in the semiconductor body 100 from the termination region 690 into direction of the first and second contact structures 315, 316 do not pass such n doped regions that are connected to the potential of the first load electrode 310 and that contain a sufficient net dopant concentration for that a resulting volt age drop along the interface between the n doped region and the body extension zone 116 opens a parasitic BJT formed by the n-doped region, the body extension zone 116 and the n-doped first regions 181.

Second holes 402b that may pass the second source zones 112 in the direction of the transistor cell region 610 generate a negative voltage drop along the second source zones 112 with respect to the second contact structure 316. The negative voltage drop does not turn on the parasitic BJT formed from the second source zone 112, the body extension zone 116 and the n-type first regions 181. On the other hand, the presence of the second source zones 112 reduces hole emitter efficiency in the transition region 650 in the reverse-biased mode such that less charge carriers are injected into the termination and transition region 690, 650.

Figure 3B:
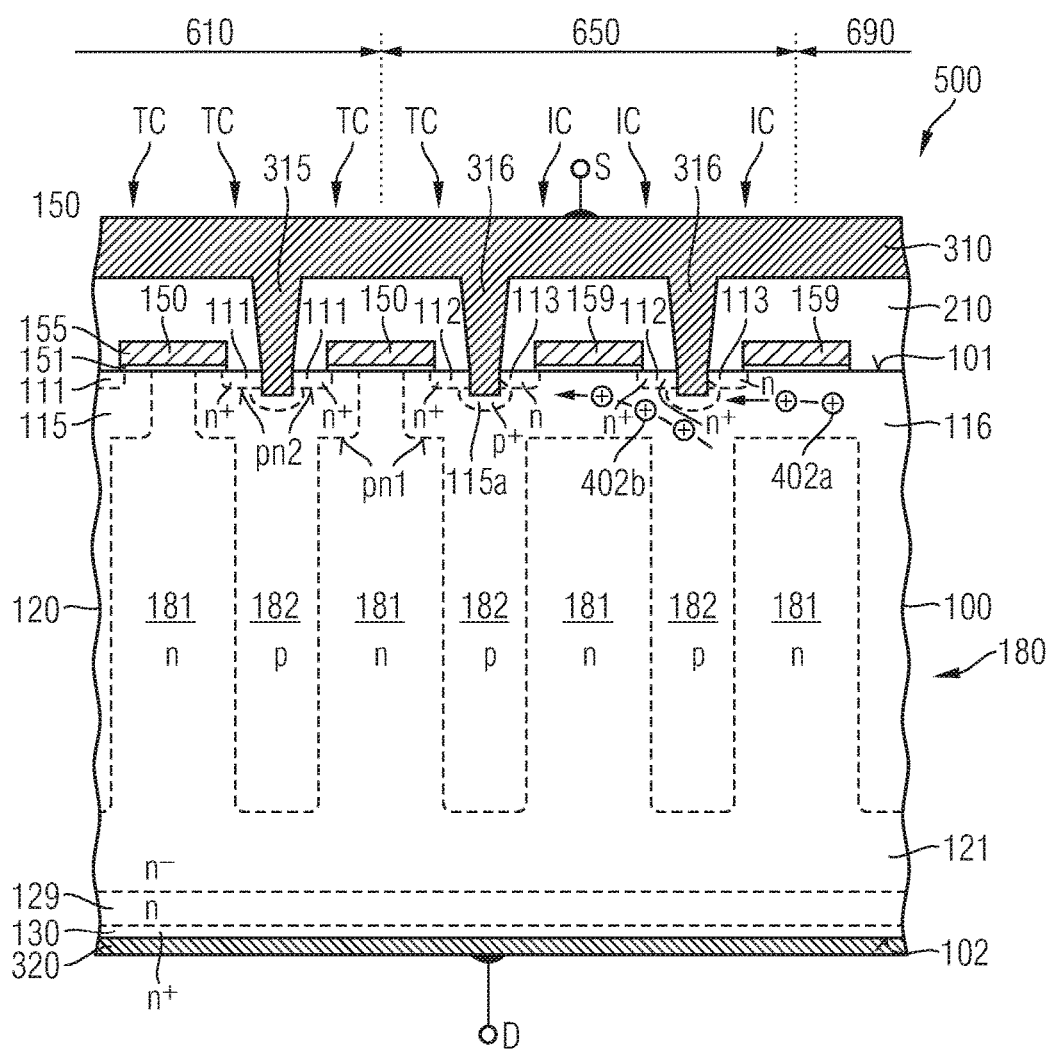
FIG. 3B is a schematic vertical cross-sectional view of a portion of semiconductor device according to another embodiment with a transition region formed between a transistor cell region and a termination region without contact structures to a first load electrode.

The semiconductor device 500 illustrated in FIG. 3B differs from the one in FIG. 3A in that n-doped regions 113 with a lower net dopant concentration, i.e., a lower n-type dose than the second source zones 112 are formed at a side of the second contact structures 316 oriented to the termination region 690. Due to the lower dopant concentration in the n-doped regions 113, the flow of first holes 402a passing the doped regions 113 into direction of the respective second contact structures 316 is not sufficient to turn on a parasitic BJT formed from the n-doped regions 113, the body extension zone 116 and the n-type first regions 181. The n-doped regions 113 may further reduce hole injection into the transition region 650.

The transistor cells TC and the idle cells IC may be stripe-shaped, wherein the transistor cells TC form a pattern of regularly arranged stripes, or rather dot-shaped, wherein the transistor cells TC and the idle cells IC are arranged in lines and columns.

The first and second contact structures 315, 316 may extend into the semiconductor body 100 as illustrated FIGS. 3A and 3B.

In FIG. 3C the first and second contact structures 315, 316 are planar contacts that directly contact the first surface 101 of the semiconductor body 100 without extending into the semiconductor body 100. The body contact regions 115a of the transistor cells TC may directly adjoin the first surface 101 in a central portion of a contact opening between neighboring gate structures 150 and between opposite first and second source zones 111, 112. The body contact regions 115a of the idle cells IC may extend from the center to the gate structure 150 at the side oriented to the termination region 690 as illustrated for the idle cell IC on the left or may be formed exclusively in the center of the contact opening as illustrated for the idle cell IC on the right.

Figure 3D:
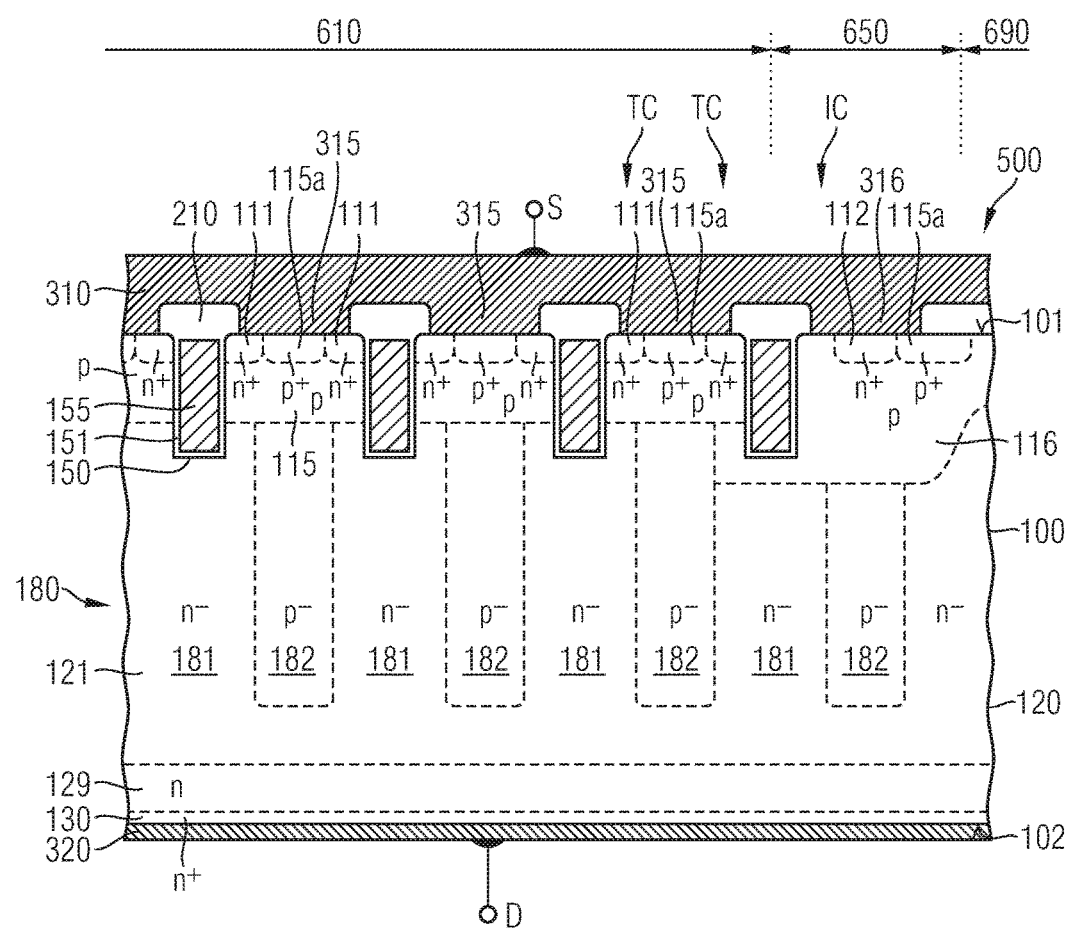
FIG. 3D is a schematic vertical cross-sectional view of a portion of semiconductor device according to an embodiment with trench gate structures and an outermost contact structure adjoining an asymmetric, doped region.
Figure 3E:
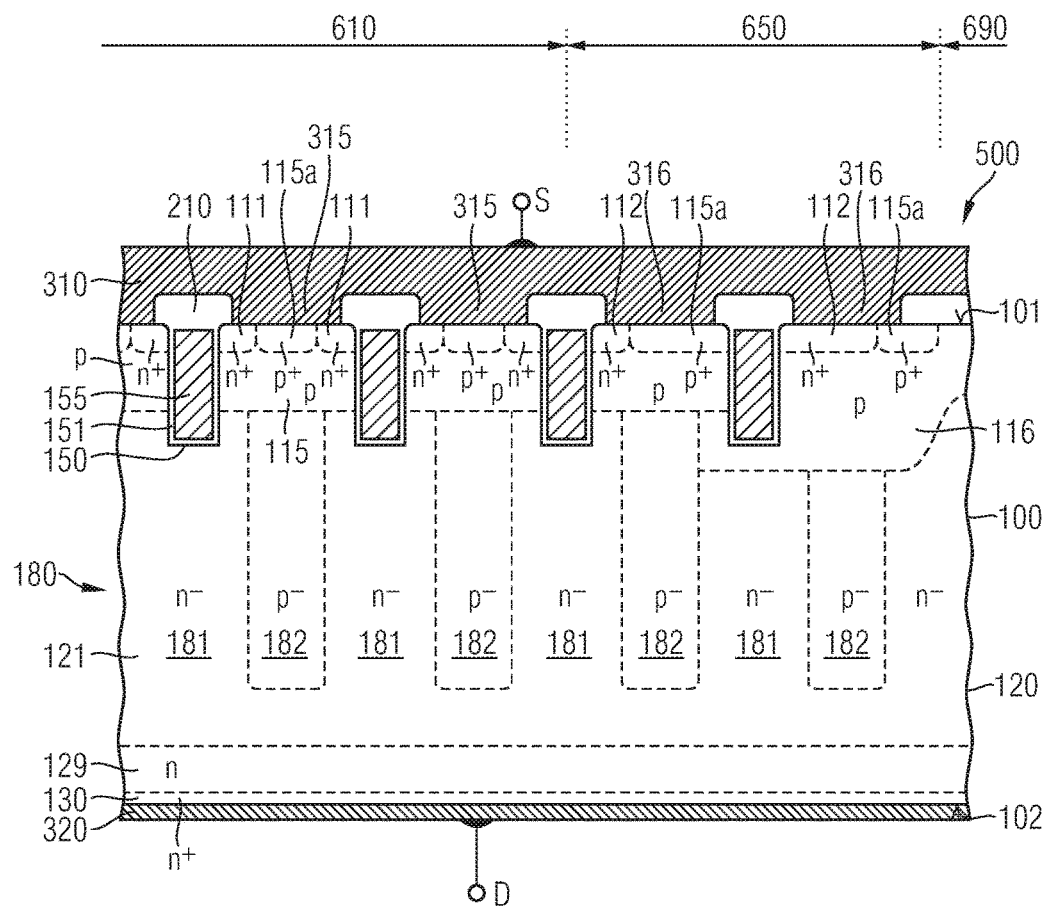
FIG. 3E is a schematic vertical cross-sectional view of a portion of semiconductor device according to another embodiment with trench gate structures and outermost contact structures adjoining asymmetric, doped regions.

FIGS. 3D and 3E concern semiconductor devices 500 whose gate structures 150 are trench gate structures extending in the vertical projection of first regions 181 of the superjunction structure 180 from the first surface 101 into the semiconductor body 100. A vertical extension of the trench gate structures may be greater than a vertical extension of the body zones 115 such that the trench gate structures extend into the first regions 181. A vertical extension of a body extension zone 116 may be greater than a vertical extension of the outermost trench gate structure such that the body extension zone 116 separates the outermost trench gate structure from the drift structure 120. For further details reference is made to the description of FIGS. 3A to 3C.

At least one second contact structure 316 extends between the outermost trench gate structure and the termination region 690 through the interlayer dielectric 210 to the semiconductor body 100. A second source zone 112 that directly adjoins to the second contact structure 316 is mainly formed in the half of the contact opening oriented to the transistor cell region 610. A body contact region 115a may directly adjoin to the second contact structure 316 between the second source zone 112 and the termination region 690. The second source zone 112 may be separated from the outermost trench gate structure.

In FIG. 3E the second source zone 112 directly adjoins to the outermost trench gate structure. First source zones 111 that directly adjoin to one, two or more outermost trench gate structures at the side oriented to the transistor cell region 610 may be omitted. In the illustrated embodiment, no first source zone is formed at the side of the outermost trench gate structure oriented to the transistor cell region 610.

FIG. 4A shows a schematic plan view of FIG. 3A in case of stripe-shaped gate structures 150, of stripe-shaped transistor cells TC and stripe-shaped idle gates 159 of idle cells IC, wherein a horizontal dimension along longitudinal axes of the gate structures 150 exceeds ten times or more a horizontal extension along their transverse axes. Stripe-shaped first and second contact structures 315, 316 extend between neighboring gate structures 150. According to other embodiments, the contact structures 315, 316 may be lines of a plurality of separated contact structures, respectively. In the transistor cell region 610 the first source zones 111 are symmetric to the intermediate first contact structures 315 with respect to a center axis parallel to the interface between the transistor cell region 610 and the transition region 650. In the transition region 650 the second source zones 112 are exclusively formed at that side of the second contact structures 316 which is oriented to the transistor cell region 610. At the opposite side, which is oriented to the termination region 690, the second contact structures 316 may directly adjoin to the body extension zone 116.

FIG. 4B refers to a plan view of FIG. 3A in case of a layout with dot-shaped transistor cells TC with two orthogonal horizontal dimensions within the same order of magnitude. In the transistor cell region 610 the first contact structure 315 may be completely surrounded by first source zones 111 in all horizontal directions. The gate structures 150 may be connected and may form a grid. Horizontal cross-sections of the meshes of the grid may be regular polygons, for example, hexagons or squares with or without rounded or chamfered corners, ovals or circles. The layouts of FIGS. 4A and 4B may also be combined with embodiment of FIG. 3B.

The termination region 690 directly adjoins the transition region 650 and does neither include transistor cells TC, nor idle cells IC nor any contact structure electrically connecting the first load electrode 310 with the semiconductor body 100.

Figure 5:
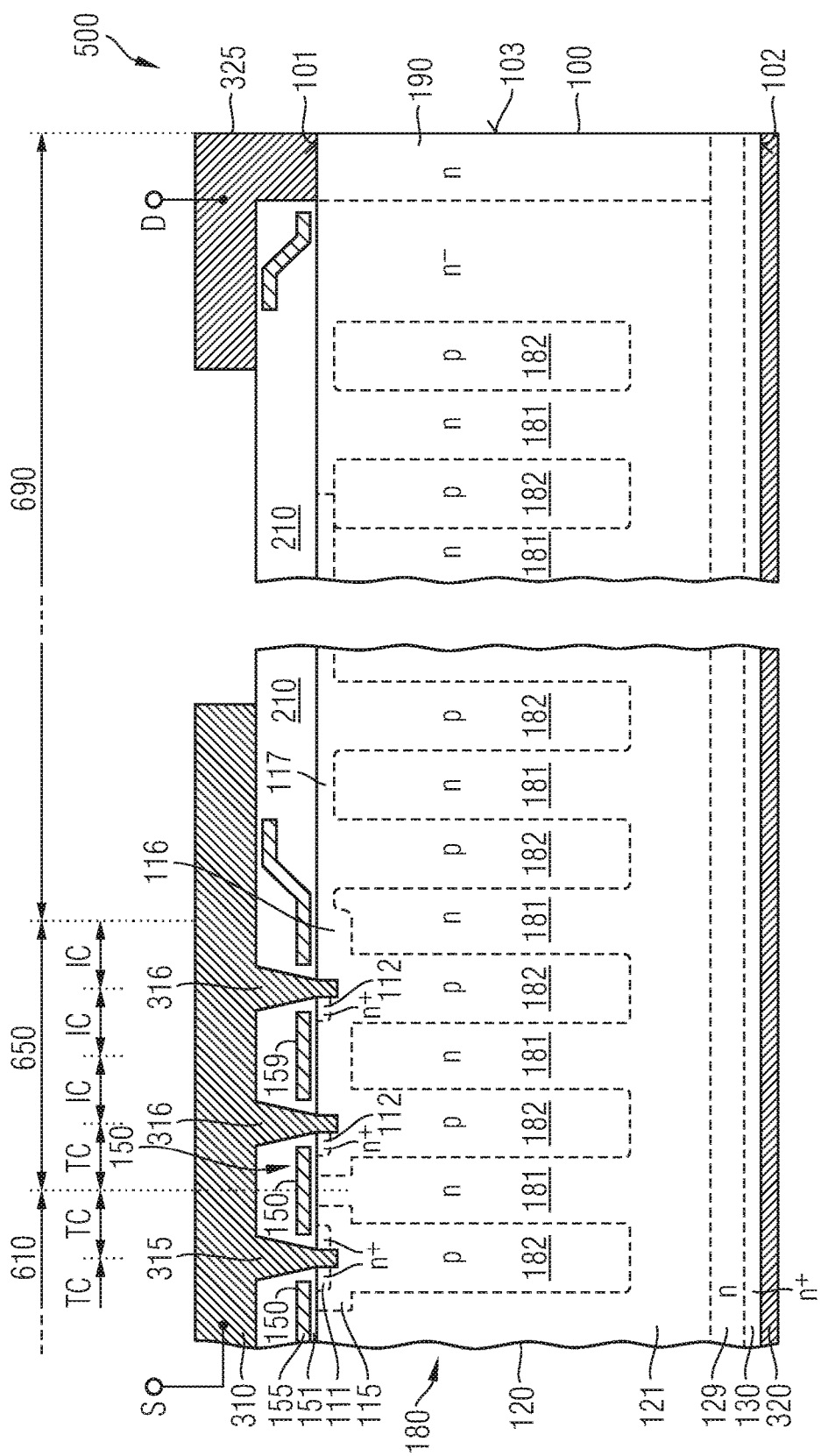
FIG. 5 is a schematic cross-sectional view of an edge portion of a semiconductor device according to a further embodiment.

In FIG. 5 the termination region 690 includes a third portion of the superjunction structure 180 and a junction termination extension 117 of the conductivity type of the body extension zone 116, wherein the junction termination extension 117 directly adjoins the body extension zone 116. The junction termination extension 117 may be shallower than the body extension zone 116 and may directly adjoin to the first surface 101 or may be separated from the first surface 101 by a counter-doped zone.

The termination region 690 extends from the transition region 650 to an outer lateral surface 103 of the semiconductor body 100, wherein the outer lateral surface 103 connects the first surface 101 and the second surface 102. A heavily doped connection zone 190 of the conductivity type of the contact layer 130 may be formed along the outer lateral surface 103 and may extend from the first surface 101 to or into the field stop layer 129 or to or into the contact layer 130. An outer electrode 325 may be electrically connected to the connection zone 190 at the front side either through an n+ doped region or a p-doped region and may form or may be directly connected to the drain terminal D. For further details, reference is made to the description of FIGS. 1 to 4B.

Typically a lateral width of the termination region 690 is greater than a vertical extension of the drift structure 120 and a great number of mobile charge carriers may flood the termination region 690 in case the semiconductor device 500 reverse-biased. In the reverse-biased mode the one-sided, asymmetric second source zones 112 in the transition region 650 reduce hole injection efficiency of the body contact regions 115a connected to the second contact structures 316 and contribute to decreasing the charge carrier plasma density in the termination region 690. The absence of heavily n-doped regions at the opposite sides of the second contact structures 316 prevents a parasitic BJT from turning on such that device reliability is enhanced compared to devices with symmetric source zones in transition regions 650.

Figure 6A:
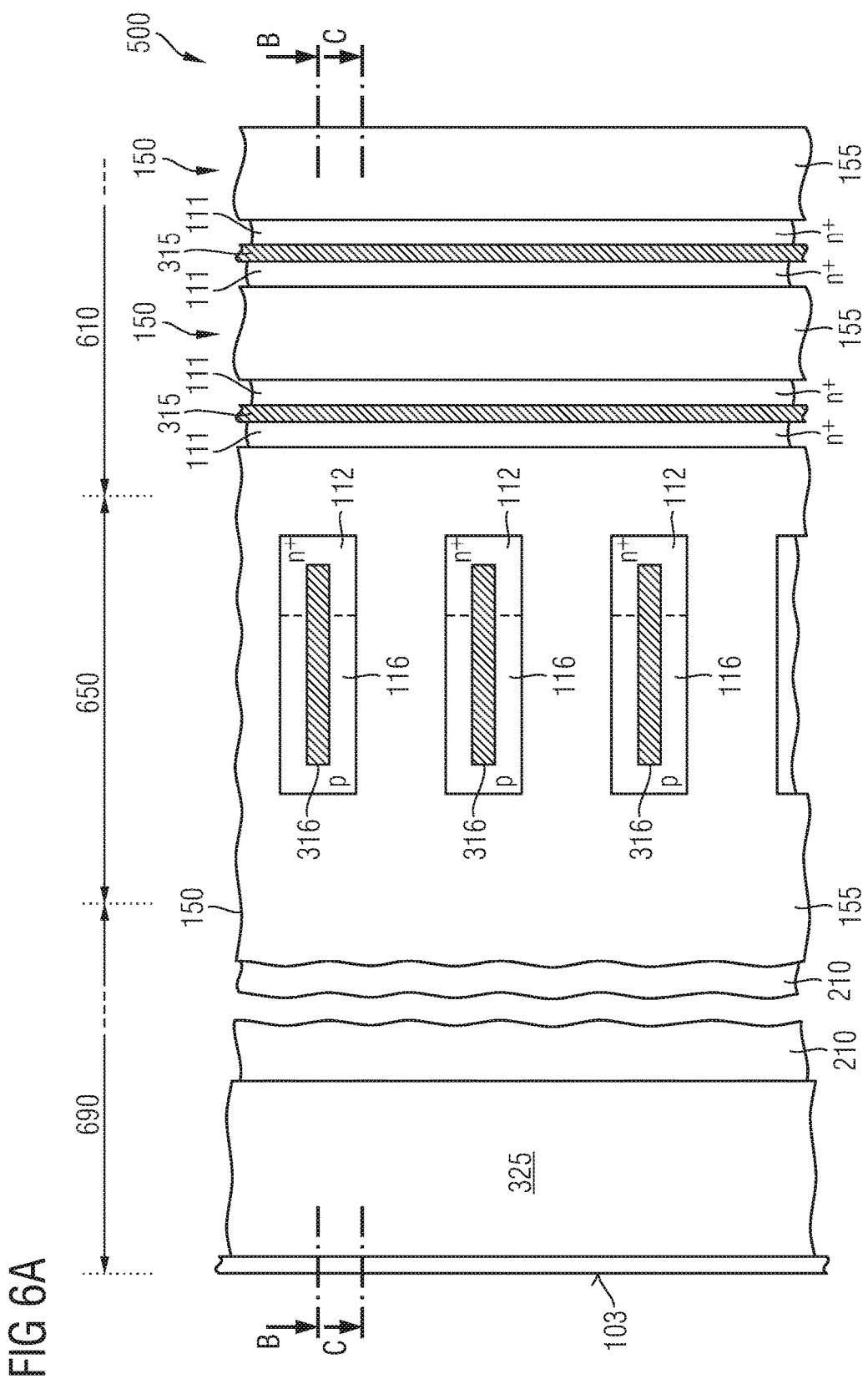
FIG. 6A is a schematic plan view of a portion of a semiconductor device according to an embodiment concerning a transition region that includes transistor cells with a longitudinal extension orthogonal to a longitudinal extension of transistor cells in a transistor cell region.
Figure 6B:
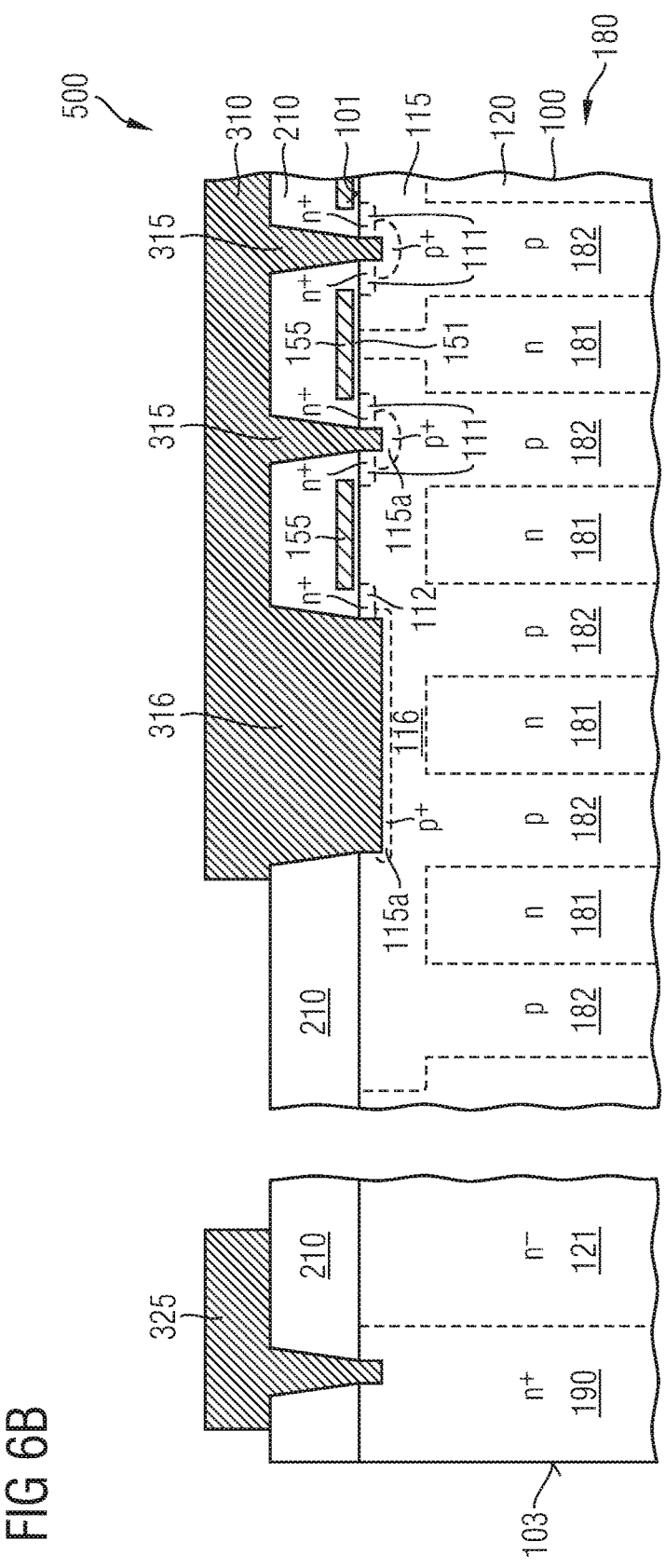
FIG. 6B is a schematic vertical cross-sectional view of the semiconductor device portion of FIG. 6A along line B-B.
Figure 6C:
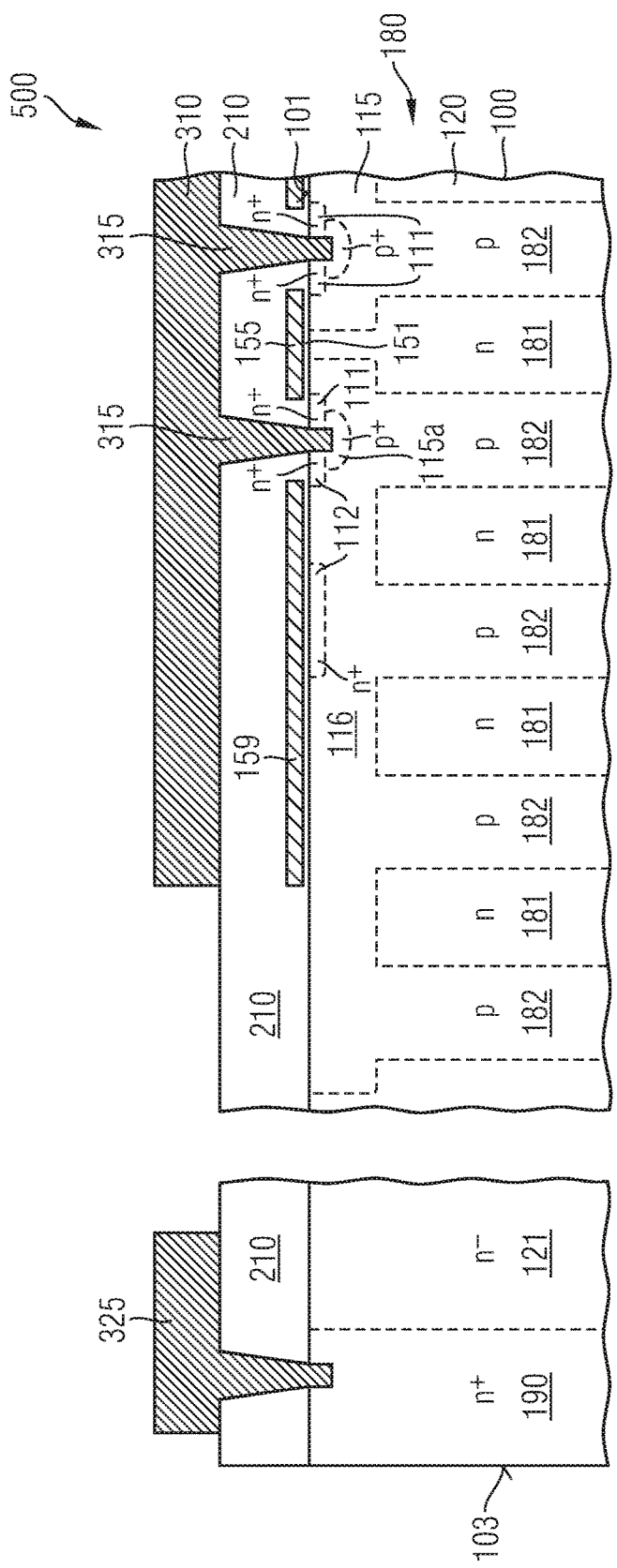
FIG. 6C is a schematic vertical cross-sectional view of the semiconductor device portion of FIG. 6A along line C-C.

FIGS. 6A to 6C refer to an embodiment with the first contact structures 315 having a longitudinal extension along a first horizontal direction and the second contact structures 316 having a longitudinal extension in a second horizontal direction orthogonal to the first horizontal direction and the first contact structures 315. The second source zones 112 are formed asymmetrically with respect to a transverse center axis of the second contact structures 316, wherein the transverse center axis is parallel to an interface between the transistor cell region 610 and the transition region 650 and parallel to the longitudinal extension of the first contact structures 315. The second source zones 112 are exclusively formed at the side of the second contact structures 316 oriented to the transistor cell region 610 and are absent at least at the ending of the side of the second contact structures 316 averted from the transistor cell region 610. The second zone 112 may be formed exclusively along the longitudinal sides of the second contact structures 316 or may also include a portion at the narrow side oriented to the transistor cell region 610. The second source zone 112 may extend along at most 90%, for example at most 75% or at most 50% of the longitudinal extension of the second contact structures 316.

At the side averted from the transistor cell region 610 and oriented to the outer lateral surface 103, the second contact structures 316 may directly adjoin to portions of a doped zone with the conductivity type of the body zones 115, for example to portions of a body zone, portions of a body extension zone 116 or a junction termination extension.

Second contact structures 316 and idle cells IC may be formed not only between transistor cell region 610 and termination region 690 but also between transistor cell region 610 and other regions of the semiconductor device without active transistor cells, for example, in a vertical projection of a gate metallization, e.g., gate pad, gate runner, or gate finger, along interfaces to logic blocks and along interfaces to embedded sensor structures.

In FIG. 7 the transistor cell region 610 includes continuous stripe-shaped transistor cells TC, wherein the first contact structures 315 form continuous lines. According to another embodiment a plurality of separated transistor cells TC may be formed along each of a plurality of transistor lines with discontinuous first contact structures 315, wherein in separation regions between transistor cells TC assigned to the same transistor line the first contact structures 315 of neighboring transistor cells TC are separated from each other, and wherein the separation regions are devoid of source zones. The transition region 650 includes an outer corner portion 652 with the shape of a segment of a circle. In the outer corner portion 652 a first group of stripe-shaped second contact structures 316a of different length runs orthogonal to a second group of stripe-shaped second contact structures 316b of different length. The outer corner portion 652 may be sandwiched between a transistor cell region 610 and an inner corner of an idle region, which may be a gate region or a termination region 690 as illustrated. In the transition region 650 second source zones 112 are spaced from those narrow sides of the stripe-shaped second contact structures 316a, 316b that are oriented to the idle region. According to another embodiment, the second source zones 112 may be spaced form both narrows sides, wherein the distance to the narrow side oriented to the transistor cell region 610 is smaller than to the narrow side oriented to the idle region.

In an idle portion 653 of the transition region 650 along those narrow sides of the second contact structures 316 that are oriented to the idle region, no source zones are formed. Instead a p-doped region 115z, e.g., portions of body zones 115, a body extension zone 116 or a junction termination extension may directly adjoin the first surface. The idle portion 653 may form a stripe-shaped segment of a circle.

Figure 8A:
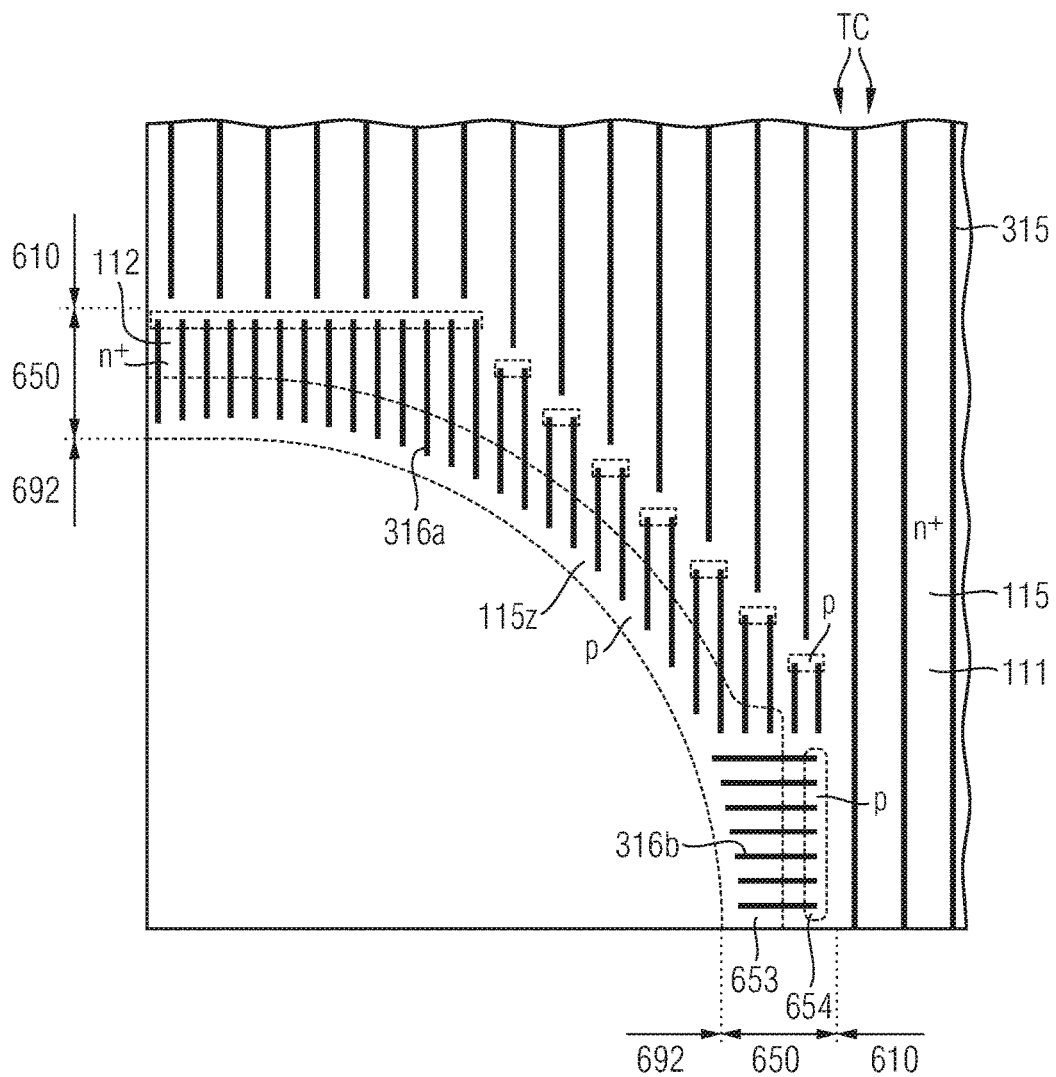
FIG. 8A is a schematic plan view of a portion of a semiconductor device close to a gate pad according to an embodiment concerning a transition region between a transistor cell region and a gate region.

FIG. 8A shows a transition region 650 sandwiched between a transistor cell region 610 and a gate region 692, which is devoid of active transistor cells. The gate region 692 is a portion of the semiconductor body 100 in the vertical projection of a gate metallization, e.g., a gate pad, a gate finger, or a gate runner.

The transition region 650 may include a first group of stripe-shaped second contact structures 316a with longitudinal axes parallel to the longitudinal axes of the transistor cells TC as well as a second group of stripe-shaped second contact structures 316b with longitudinal axes orthogonal to the longitudinal axes of the transistor cells TC. The arrangement reduces the gate conductor resistance, because the gate conductor can run between the second contact structures 316a, 316b. A center-to-center distance between neighboring second contact structures 316a, 316b may be smaller than a center-to-center distance between neighboring stripe-shaped first contact structures 315. The second source zones 112 may have a distance of at most 1 µm, 2 µm, 5 µm, or 10 µm to the narrow side of the second contact structures 316a, 316b oriented to the gate region 692, for example of at most 20% of the longitudinal extension of the second contact structures 316 and are mainly formed at a side of the second contact structures 316 oriented to the transistor cell region 610. The second source zones 112 may also be absent in further idle regions 654 at the narrow side of the second contact structures 316 oriented to the transistor cell region 610.

The semiconductor device 500 in FIG. 8B includes a plurality of separated transistor cells TC formed along each of a plurality of transistor lines with discontinuous first contact structures 315. Separation regions 615 separate transistor cells TC assigned to the same transistor line such that the first source zones 111 are spaced from both narrow sides of the first contact structures 315.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a transistor cell region comprising a first portion of a super junction structure and first contact structures electrically connecting a first load electrode with first source zones of transistor cells, wherein the first source zones are formed on opposite sides of the first contact structures; and
a transition region directly adjoining to the transistor cell region and comprising a second portion of the super junction structure and a second contact structure electrically connecting the first load electrode with a second source zone, wherein the second source zone is formed only at a side of the second contact structure oriented to the transistor cell region.

2. The semiconductor device of claim 1, wherein the transition region separates the transistor cell region from an idle region without transistor cells.

3. The semiconductor device of claim 2, wherein the idle region comprises a termination region surrounding the transistor cell region and directly adjoining to an outer lateral surface of a semiconductor body of the semiconductor device.

4. The semiconductor device of claim 2, wherein the idle region comprises a gate region in a vertical projection of a gate metallization.

5. The semiconductor device of claim 1, wherein the first source zones in the transistor cell region surround the first contact structures in the transistor cell region.

6. The semiconductor device of claim 1, wherein the second contact structure is stripe-shaped and wherein the second source zone is spaced from both narrow sides of the second contact structure and asymmetric with respect to a transversal center axis of the second contact structure.

7. The semiconductor device of claim 1, wherein the transition region is devoid of doped regions that (i) have a conductivity type of the first source zones and (ii) directly adjoin to the second contact structure at a side averted from the transistor cell region.

8. The semiconductor device of claim 1, wherein the transition region comprises doped regions that (i) have a conductivity type of the first source zones, (ii) directly adjoin to the second contact structure at a side averted from the transistor cell region, and (iii) have a net dopant dose at most a third of the mean net dopant dose of the first source zones.

9. The semiconductor device of claim 1, wherein in the transition region at least two second contact structures are formed on a straight line orthogonal to an interface between the transistor cell region and the transition region.

10. The semiconductor device of claim 1, wherein the second source zone is embedded in a body extension zone of an opposite conductivity type, the body extension zone separating, in the transition region, first regions of the super junction structure from a first surface of the semiconductor body.

11. The semiconductor device of claim 1, wherein the second regions form unipolar homojunctions with body zones of the transistor cells.

12. The semiconductor device of claim 1, wherein the transistor cells in the transistor cell region are stripe-shaped and comprise stripe-shaped gate structures with longitudinal axes parallel to a first horizontal direction.

13. The semiconductor device of claim 12, wherein the transistor cells in the transition region comprise stripe-shaped idle gate structures with longitudinal axes parallel to a second horizontal direction orthogonal to the first horizontal direction.

14. The semiconductor device of claim 1, wherein a minimum longitudinal extension of the second source zone is the length of the second contact structure less 10 μm.

15. The semiconductor device of claim 1, wherein a first group of stripe-shaped second contact structures runs orthogonal to a second group of stripe-shaped second contact structures.

16. The semiconductor device of claim 15, wherein a distance of the second source zones to a first narrow side of the second contact structure oriented to the transistor cell region is smaller than a distance of the second source zones to a second narrow side of the second contact structure oriented to the termination region.

17. The semiconductor device of claim 1, wherein the transistor cells are arranged in transistor lines, each transistor line comprising a plurality of separated transistor cells with first contact structures and with first source zones spaced from both narrow sides of the first contact structures.

18. The semiconductor device of claim 1, wherein each first contact structure directly adjoins a first source zone and the second contact structure directly adjoins a second source zone.

* * * * *